US009412728B2

(12) United States Patent
Guiducci et al.

(10) Patent No.: US 9,412,728 B2
(45) Date of Patent: Aug. 9, 2016

(54) POST-CMOS PROCESSING AND 3D INTEGRATION BASED ON DRY-FILM LITHOGRAPHY

(71) Applicant: ECOLE POLYTECHNIQUE FEDERALE DE LAUSANNE (EPFL), Lausanne (CH)

(72) Inventors: Carlotta Guiducci, Morges (CH); Yusuf Leblebici, Lutry (CH); Yuksel Temiz, Zug (CH)

(73) Assignee: ECOLE POLYTECHNIQUE FEDERALE DE LAUSANNE (EPFL) (CH)

( * ) Notice: Subject to any disclaimer, the term of this patent is extended or adjusted under 35 U.S.C. 154(b) by 0 days.

(21) Appl. No.: 14/418,842

(22) PCT Filed: Jul. 19, 2013

(86) PCT No.: PCT/IB2013/055946
§ 371 (c)(1),
(2) Date: Jan. 30, 2015

(87) PCT Pub. No.: WO2014/020479
PCT Pub. Date: Feb. 6, 2014

(65) Prior Publication Data
US 2015/0371978 A1   Dec. 24, 2015

(30) Foreign Application Priority Data

Aug. 3, 2012   (EP) .................................. 12179308

(51) Int. Cl.
H01L 21/00     (2006.01)
H01L 25/00     (2006.01)
(Continued)

(52) U.S. Cl.
CPC .............. *H01L 25/50* (2013.01); *G03F 7/2022* (2013.01); *G03F 7/32* (2013.01); *H01L 21/76898* (2013.01); *H01L 24/83* (2013.01); *H01L 2224/83203* (2013.01)

(58) Field of Classification Search
CPC ................... H01L 21/02381; H01L 21/02532; H01L 27/08; H01L 21/76898
USPC ................................... 438/107, 109, 110, 113
See application file for complete search history.

(56) References Cited

U.S. PATENT DOCUMENTS 7,026,184 B2 *   4/2006   Xie .................... B81B 7/0006
                                                          438/107
2007/0254455 A1   11/2007   Yamaguchi et al.
(Continued)

FOREIGN PATENT DOCUMENTS

EP    1536673 A1     6/2005
JP    2004-039667    2/2004
(Continued)

OTHER PUBLICATIONS

International Search Report prepared by the European Patent Office on Nov. 28, 2013, for International Application No. PCT/IB2013/055946.
(Continued)

Primary Examiner — S. V. Clark
(74) Attorney, Agent, or Firm — Sheridan Ross P.C.

(57) ABSTRACT

A method for performing a post processing pattern on a diced chip having a footprint, comprises the steps of providing a support wafer; applying a first dry film photoresist to the support wafer; positioning a mask corresponding to the footprint of the diced chip on the first dry film photoresist; expose the mask and the first dry film photoresist to UV radiation; remove the mask; photoresist develop the exposed first dry film photoresist to obtain a cavity corresponding to the diced chip; positioning the diced chip inside the cavity; applying a second dry film photoresist to the first film photoresist and the diced chip; and expose and develop the second dry film photoresist applied to the diced chip in accordance with the post processing pattern.

2 Claims, 9 Drawing Sheets

(51) Int. Cl.
*H01L 21/768* (2006.01)
*H01L 23/00* (2006.01)
*G03F 7/20* (2006.01)
*G03F 7/32* (2006.01)

(56) References Cited

U.S. PATENT DOCUMENTS

| | | | |
|---|---|---|---|
| 2008/0188059 A1* | 8/2008 | Yazdi | B81C 1/00253 438/456 |
| 2009/0230554 A1 | 9/2009 | Kaufmann et al. | |
| 2010/0062564 A1 | 3/2010 | Sakaguchi et al. | |
| 2010/0264538 A1* | 10/2010 | Swinnen | H01L 21/76898 257/737 |

FOREIGN PATENT DOCUMENTS

| | | |
|---|---|---|
| JP | 2004039667 A | 2/2004 |
| JP | 2004-119659 | 4/2004 |
| JP | 2004119659 A | 4/2004 |

OTHER PUBLICATIONS

Written Opinion prepared by the European Patent Office on Nov. 28, 2013, for International Application No. PCT/IB2013/055946.

Temiz Y et al: "Post-CMOS Processing ad 3-D Integration Based on Dry-Film Lithography", IEEE Transactions on Components, Packaging and Manufacturing Technology, vol. 3, No. 9, Jan. 11, 2013, pp. 1458-1466.

Lee B-W et al: "Chip-last Embedded Active for System-On-Package (SOP)", 57th Electronic Components and Technology Conference, 2007 (ECTC '07), Proceedings, IEEE, PI, May 1, 2007, pp. 292-298.

Tsai B-H et al: "Unique Dry Film Solution for Through Silicon Via Process", 2008 International Conference on Electronic Materials and Packaging (EMAP 2008), Taipei, Taiwan, Oct. 22-44, 2008, [In Conjunction With The 3rd International Microsystems, Packaging, Assembly and Circuits Technology Conference (IMPACT)], IEEE, Oct. 22, 2008, pp. 69-71.

Topper M etal: "Coating Techniques for 3D-Packaging Applications", 62nd Electronic Components and Technology Conference (ECTC), 2012, IEEE, May 29, 2012, pp. 1673-1676.

Beanato et al. "Design and Testing Strategies for Modular 3-D-Multiprocessor Systems Using Die-Level Through Silicon Via Technology," IEEE Journal on Emerging and Selected Topics in Circuits and Systems, Jun. 2012, vol. 2, No. 2, pp. 295-306.

Beica et al. "Through Silicon Via Copper Electrodeposition for 3D Integration," Proceedings of the 58th Electronic Components and Technology Conference (ECTC 2008), 2008, pp. 577-583.

Chen et al. "Chip-to-Wafer (C2W) 3D Integration with Well-Controlled Template Alignment and Wafer-Level Bonding," Proceedings of the IEEE 61st Electronic Components and Technology Conference (ECTC), 2011, 6 pages.

Civale et al. "3-D Wafer-Level Packaging Die Stacking Using Spin-on-Dielectric Polymer Liner Through-Silicon Vias," IEEE Transactions on Components, Packaging and Manufacturing Technology, Jun. 2011, vol. 1, No. 6, pp. 833-840.

Dalin et al. "Self-Assembly of Micro-Parts using Electrostatic Forces and Surface Tension," Electronic Components and Technology Conference, May 2009, pp. 1517-1524.

Farooq et al. "3D Copper TSV Integration, Testing and Reliability," IEEE International Electron Devices Meeting (IEDM) Dec. 2011, pp. 7.1.1-7.1.4.

Fedder et al. "Technologies for Cofabricating MEMS and Electronics," Proceedings of the IEEE, Feb. 2008, vol. 96, No. 2, pp. 306-322.

Fonstad, Jr. "Magnetically-Assisted Statistical Assembly—a new heterogenous integration technique," Advanced Materials for Micro- and Nano-Systems (AMMNS, Jan. 2002, Singapore-MIT Alliance (SMA), 7 pages.

Fukushima et al. "Evaluation of Alignment Accuracy on Chip-to-Wafer Self-Assembly and Mechanism on the Direct Chip Bonding at Room Temperature," Proceedings for the IEEE International 3D Systems Integration Conference, (3DIC), 2010, pp. 1-5.

Garrou et al. Handbook of 3D Integration: Technology and Applications of 3D Integrated Circuits, 1st ed. Wiley-VCH, Oct. 2008.

Gobet et al. "IC Compatible Fabrication of Through-Wafer Conductive Vias," Proceedings of SPIE, Sep. 1997, vol. 3223, No. 1, pp. 17-25.

Henry et al. "Via First Technology Development Based on High Aspect Ratio Trenches Filled with Doped Polysilicon," Electronic Components and Technology Conference, Jun. 2007, pp. 830-835.

Jacquet et al. "Cost Effective Dry Lithography Solution for Through Silicon Via Technology," Electronic Components and Technology Conference (ECTC2009), May 2009, pp. 1170-1176.

Ko et al. "Low temperature bonding technology for 3D integration," Microelectronics Reliability, Feb. 2012, vol. 52, No. 2, pp. 302-311.

Ko et al. "Wafer-level bonding/stacking technology for 3D integration," Microelectronics Reliability, Apr. 2010, vol. 50, No. 4, pp. 481-488.

Koester et al. "Wafer-level 3D integration technology," IBM Journal of Research and Development, Nov. 2008, vol. 52, No. 6, pp. 583-597.

Koyanagi et al. "Three-Dimensional Integration Technology Based on Wafer Bonding With Vertical Buried Interconnections," IEEE Transactions on Electron Devices, Nov. 2006, vol. 53, No. 11, pp. 2799-2808.

Kukharenka et al. "Electroplating moulds using dry film thick negative photoresist," Journal of Micromechanics and Microengineering, 2003, vol. 13, pp. S67-S74.

Lau "TSV Manufacturing Yield and Hidden Costs for 3D IC Integration," Proceedings of the 60th Electronic Components and Technology Conference (ECTC), 2010, pp. 1031-1042.

Lee et al. "Wafer-to-Wafer Alignment for Three-Dimensional Integration: A Review," Journal of Microelectromechanical Systems, Aug. 2011, vol. 20, No. 4, pp. 885-898.

Mitsuhashi et al. "Development of 3D-Packaging Process Technology for Stacked Memory Chips," MRS Online Proceedings Library, 2007, vol. 970, pp. 155-162.

Moore "Cramming more components onto integrated cicuits," Electronics, Apr. 19, 1965, vol. 38, No. 8, 4 pages.

Niklaus et al. "Adhesive wafer bonding," Journal of Applied Physics, 2006, vol. 99, No. 3, 29 pages.

Olmen et al. "3D Stacked IC demonstrator using Hybrid Collective Die-to-Wafer Bonding with copper Through Silicon Vias (TSV)," Proceedings of the IEEE International Conference 3D System Integration 3DIC 2009, 2009, pp. 1-5.

Ramm et al. "Handbook of Wafer Bonding," Wiley-VCH, Feb. 2012.

Rasmussen et al. "Fabrication of High Aspect Ratio Through-Wafer Vias in CMOS Wafers for 3-D Packaging Applications," Proceedings of the 12th International Conference of Solid-State Sensors, Actuators and Microsystems, 2003, vol. 2, pp. 1659-1662.

Redolfi et al. Implementation of an Industry Compliant, 5×50μm, Via-Middle TSV Technology on 300mm Wafers, IEE Electronic Components and Technology Conference (ECTC), Jun. 2011, pp. 1384-1388.

Sakuma et al. "Characterization of Stacked Die using Die-to-Wafer Integration for high Yield and Throughput," Proceedings of the 58th Electronic Components and Technology Conference (ECTC 2008), 2008, pp. 18-23.

Souriau et al. "Temporary bonding for Chips in Wafer Processing," Proceedings of the 11th Electronics Packaging Technology Conference (EPTC '09), 2009, pp. 412-415.

Temiz et al. "3D integration technology for lab-on-a-chip applications," Electronic Letters, Dec. 2011, vol. 47, No. 26, pp. S22-S24.

Temiz et al. "A CMOS-Compatible Chip-to-Chip 3D Integration Platform," IEEE Electronic Components and Packaging Conference, 2012, pp. 555-560.

Temiz et al. "Die-Level TSV Fabrication Platform for CMOS-MEMS Integration," Proceedings for the 16th International Solid-State Sensors, Actuators and Microsystems Conference, Transducers, Jun. 2011, pp. 1799-1802.

(56) References Cited

OTHER PUBLICATIONS

Vulto et al. "A full-wafer fabrication process for glass microfluidic chips with integrated electroplated electrodes by direct bonding of dry film resist," Journal of Micromechanics and Microengineering, Jul. 2009, vol. 19, No. 7, 6 pages.

Vulto et al. "Microfluidic channel fabrication in dry film resist for production and prototyping of hybrid chips," Lab on a Chip, Jan. 2005, vol. 5, No. 2, pp. 158-162.

Zhao et al. "Direct projection on dry-film photoresist (DP2): do-it-yourself three-dimensional polymer microfluidics," Lab on a Chip, Apr. 2009, vol. 9, No. 8, pp. 1128-1132.

* cited by examiner

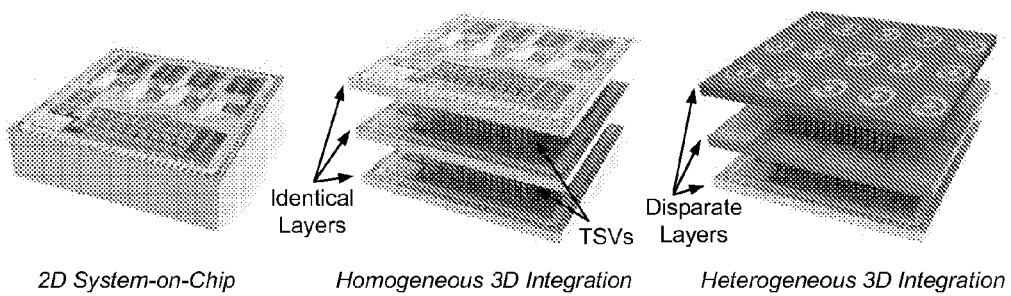

2D System-on-Chip     Homogeneous 3D Integration     Heterogeneous 3D Integration

Figure 1

| | |
|---|---|
| Process steps | TSV fabrication, thinning, alignment, bonding |
| TSV type | Via-first, via-middle, via-last before bonding, via-last after bonding |
| Singulation level | Wafer-to-wafer, chip-to-wafer, chip-to-chip |
| Stacking orientation | Face-to-face, back-to-face |
| Bonding | Metal-metal, dielectric-to-dielectric, hybrid |
| Alignment | W2W aligner, pick-and-place, template alignment, electrostatic, magnetic, surface-tension-driven |

POST-CMOS PROCESSING AND 3D INTEGRATION BASED ON DRY-FILM LITHOGRAPHY

CROSS REFERENCE TO RELATED APPLICATIONS

This application is a national stage application under 35 U.S.C. 371 and claims the benefit of PCT Application No. PCT/IB2013/055946 having an international filing date of Jul. 19, 2013, which designated the United States, which PCT application claimed the benefit of European Patent Application No. 12179308.7 filed Aug. 3, 2012, the disclosures of both the above-identified applications are incorporated herein by reference.

TECHNICAL FIELD

The present invention is in the field of chip fabrication.

BACKGROUND

The continuing demand for faster and smaller ICs has led to aggressive downscaling in transistor sizes, as predicted by Moore's Law [1]. Today's state of the art IC technology offers fascinating levels of performance and functionality, while introducing new barriers and challenges for further downscaling. As conventional planar IC de-signs have almost reached the limits, an emerging technology called three-dimensional integrated circuit (3D-IC) promises new possibilities to achieve higher volumetric transistor density. This technology enables the integration of multiple layers with vertical interconnections, providing potential performance improvements even in the absence of device scaling. Extensive studies by numerous research groups have already verified the potential of this technology for better electrical performance, lower power consumption, lower noise, smaller form factor, and more functionality [2].

In the earlier system implementation approaches, chips with different functionalities were manufactured independently and assembled by wire bonds and global interconnects. This resulted in systems with significant signal transmission delays leading to limited operation frequency, which eventually could not meet the demands of the electronics market. Later, system-on-chip (SoC) integration approach was introduced, wherein different functional blocks, such as analog, digital, memory etc. . . . are merged in a single substrate. Although this scheme is very promising at first glance, it leads to a larger die area, which eventually reduces the manufacturing yield. Moreover, a particular choice of technology that is good for one circuit type is not always good for the others. Therefore, optimizing the system in favor of all elements has become an additional design and fabrication challenge. Moreover, gradually lengthening on-chip interconnects due to higher system complexity and larger die area have led to increase in the communication latency, and therefore, limited the operation speed once again after the era of hybrid technologies. Power consumption has also increased by the higher number of signal repeaters along the lines. In order to address the limitations of SoC, vertical packaging technologies have been developed, such as system-in-a-package (SiP) employing die stacking with wire bonds, and package-on-package (PoP). Nevertheless, the absolute benefits of "going vertical" has only been achieved by thinned chip stacking and use of TSVs, which allow significantly higher interconnection densities compared to the off-chip connections. This technology has enabled the integration of identical layers (homogeneous integration) or disparate layers with different functionality, size, and technology (heterogeneous integration), as illustrated in FIG. 1.

In view of the prior art, the present invention aims to develop a generic platform for the stacking of chips fabricated through multi-project-wafer (MPW) runs. Therefore, all the layers in the stack are already diced chips and the subsequent process steps are CMOS-compatible. We consider heterogeneous integration for sensing applications [3] and 3D multi-processor systems [4] as the target applications for the proposed technology; however, the techniques can be applied to many other applications, which require post-CMOS processing in general, such as CMOS-MEMS cofabrication [5]. The inventors previously presented chip-level post-CMOS processing techniques based on stencil lithography [6] and 3D integration techniques based on template alignment [7]. In the context of the present invention, on the other hand, we employ dry-film resist as an alternative to traditional photolithography methods. After the post-processing steps, chip-to-chip alignment is achieved by surface-tension-driven self-alignment. Furthermore, a new parylene deposition technique is proposed for via sidewall passivation without the need of bottom dielectric etching.

SUMMARY OF THE INVENTION

The invention presented herein concerns a chip-level post-CMOS processing technique for 3D integration and through-silicon-via (TSV) fabrication. The proposed technique is based on dry-film lithography, which is a low-cost and simple alternative to spin-coated resist. Unlike conventional photolithography methods, the inventive technique allows resist patterning on very high topography, thereby chip-level photolithography can be done without using any wafer reconstitution approach.

Moreover, the invention proposes a via sidewall passivation method which eliminates dielectric etching at the bottom of the via.

Accordingly, in line with a first aspect, the invention provides a method for performing a post processing pattern on a diced chip having a footprint, comprising the steps of: providing a support wafer; applying a first dry film photoresist to the support wafer; positioning a mask corresponding to the footprint of the diced chip on the first dry film photoresist; expose the mask and the first dry film photoresist to UV radiation; remove the mask; photoresist develop the exposed first dry film photoresist to obtain a cavity corresponding to the diced chip; positioning the diced chip inside the cavity; applying a second dry film photoresist to the first film photoresist and the diced chip; and expose and develop the second dry film photoresist applied to the diced chip in accordance with the post processing pattern.

In a second aspect the invention provides a method for obtaining a stack of two semiconductor layers in a back to face configuration, whereby at least one of the semiconductor layer comprises a through silicon via (TSV), comprising the steps of: provide a first semiconductor layer; provide a second semiconductor layer; making a hole through the second semiconductor layer from a face side to a back side; apply the face side of second semiconductor layer on a release tape; depositing parylene on the assembly of the second semiconductor layer and the release tape, thereby obtaining a sidewall passivation in the hole and a bonding layer on the back side of the second semiconductor; releasing the release tape, thereby obtaining a membrane of parylene covering an opening of the hole on the front side; position the back side of the second semiconductor layer relative to a face side of the first semiconductor layer; bonding the second semiconductor layer to the first semiconductor by applying pressure and heat; removing the membrane of parylene by directional etching; and electrically connecting the face side of the second semiconductor to the face side of the first semiconductor by depositing a conductor inside the hole, thereby obtaining the TSV.

BRIEF DESCRIPTION OF THE FIGURES

The invention will be better understood through the description of example embodiments and in reference to the figures, whereby FIG. 1 contains illustrations of conventional 2D, homogeneous 3D, and heterogeneous 3D integration concepts;

FIG. 1A summarizes the major 3D integration techniques, highlighting the ones used in this study;

DESCRIPTION OF EXAMPLE EMBODIMENTS OF THE INVENTION

Overview of 3D Integration Fabrication

Figure 2:
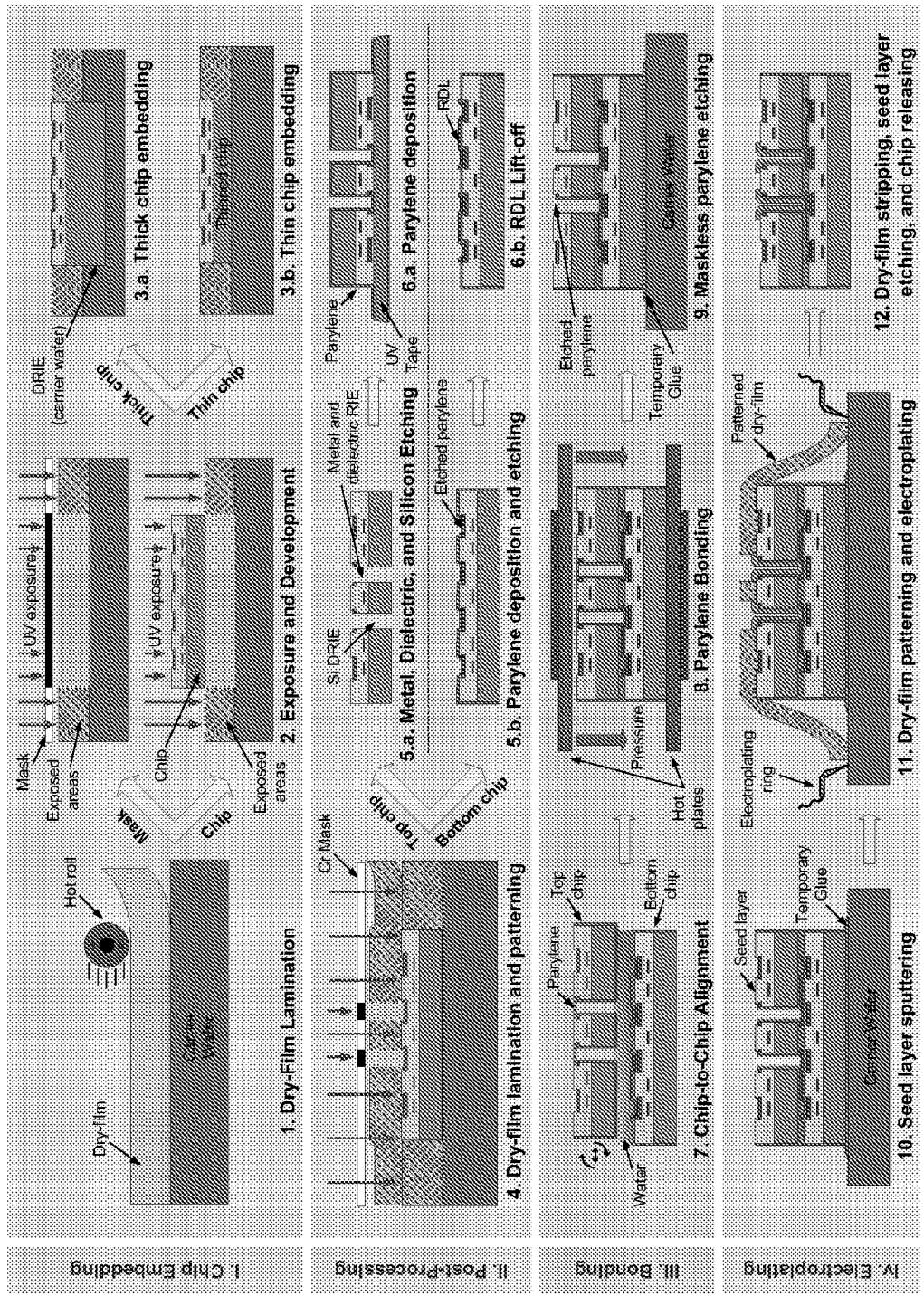
FIG. 2 illustrates the complete process flow used for post-CMOS processing and C2C stacking.

The 3D integration fabrication involves three major processing steps: (i) TSV fabrication, (ii) thinning, and (iii) wafer or chip bonding after alignment, where the order of these process steps may vary depending on the integration strategy [2]. The core element of the 3D-IC technology is the TSV, which can be categorized as via-first, via-middle, and via-last according to the sequence of the TSV fabrication steps relative to the CMOS fabrication process. In the via-first (or FEOL TSV) approach, TSVs are fabricated prior to the transistor fabrication and usually doped polysilicon is used as the conductive material [8,9,10]. Via-middle type TSV (or BEOL TSV) is fabricated in between FEOL and BEOL steps, and tungsten (W) and copper (Cu) deposited by CVD are usually employed for high-aspect-ratio via filling [11,12]. These via approaches offer several advantages such as higher TSV density and aspect-ratio; however, they may only be fabricated in a CMOS foundry. In the via-last (or post-BEOL TSV) method, on the other hand, TSV fabrication is done after the completion of CMOS foundry processes. This method enables the heterogeneous integration by stacking chips/wafers from different technologies. However, the materials and processes used during the post-processing have to be compatible with the CMOS, particularly the thermal processes.

In the via-last TSV, the vias can be introduced either before or after aligned bonding. In via-before-bonding approach, for instance, TSVs are fabricated prior to the bonding, and then metal-metal bonding is performed to electrically connect two (or more) device layers. In the via-after-bonding approach, on the other hand, the layers are first aligned and bonded, then the TSVs are fabricated. Other varieties of these techniques can be generated depending on the sequence of the thinning step and the orientation of the bonding, face-to-face (F2F), and back-to-face (B2F). In F2F bonding, two layers are bonded as the FEOL layers are facing each other; while in B2F bonding, the wafer is usually bonded to a handle wafer, the substrate is thinned by backgrinding, and the handle wafer is released after two device wafers are bonded. Various bonding techniques have been studied extensively for 3D integration [13,14], such as direct oxide/oxide bonding, metal thermo-compression bonding, metal eutectic bonding, and polymer bonding, to mention a few. In the context of the present invention polymer bonding is considered as an effective method for the bonding since it allows bonding at lower temperatures and the bonding quality is not as sensitive to the surface topography [15].

Depending on whether the integration is performed in wafer or die-level, three major chip stacking approaches can be listed as: (i) wafer-to-wafer (W2W), (ii) chip-to-wafer (C2W), and (iii) chip-to-chip (C2C). Undoubtedly, W2W integration offers the highest throughput and the alignment accuracy. However, W2W is only possible when the chip sizes are the same, substrate materials are compatible, and both wafers have very good yield. The impact of the IC chip yield on the overall TSV manufacturing cost is given with more detail in [16]. In addition, since the CMOS fabricants do not usually disclose their yield values, the estimation of the final yield would be difficult in case the integration is done in another facility. Another important difficulty for the wafer-level post-CMOS processing is that the CMOS wafer size is not always compatible to the tools available in research/university cleanrooms. For example, typical diameters of CMOS wafers are ranging from 200 mm to 300 mm, but the micromachining tools are, in general, compatible to 100 mm to 150 mm wafers. Moreover, full-wafer CMOS runs are very costly especially for research purposes and prototype development. Due to these technical limitations, die-level processing is employed here. Detailed reviews on W2W alignment and bonding can be found in [17,18,'9].

In die-level processing, on the other hand, it is possible to perform a pre-testing and to process only the working chips (Known-Good-Die or KGD), which in turn may lead to a higher yield and lower cost for a 3D chip stack. Furthermore, chips from a broad range of process, size and functionality can be integrated in principle. Nevertheless, a typical 3D integration process requires chip thinning, bonding, etching, via sidewall passivation, via metallization, and several photolithography steps, as explained before. Accomplishing all these tasks in die-level is very demanding and gives very low throughput considering the very small dimensions of the chips. To overcome the chip handling problems and to increase the throughput, C2W bonding techniques have been developed. In such integration, the KGDs can be aligned and bonded to a carrier or a CMOS wafer by pick-and-place tools [20]. Another very promising approach for C2C or C2W integration is surface-tension-driven self-assembly, where an aqueous solution is used in between the layers to be aligned [21]. Other alignment and assembly approaches, such as self-assembly with electrostatic attraction [22] and magnetically-assisted assembly [23], were previously presented. Using the etched silicon wafer as the template for C2W bonding and KGD stacking has also been demonstrated with good alignment accuracy [7,24,25]. A similar C2W alignment approach was proposed with a patterned BCB layer as the alignment template [26]. Such template alignment techniques eliminate the requirement of C2W bonding tools, and they promise comparable alignment accuracy by manual die insertion into the cavity.

FIG. 1A summarizes the major 3D integration techniques, highlighting the ones used in this study. Combinations of these individual methods and introduction of new materials and processes bring numerous strategies, and it is difficult to pick the best solution based on the current state of the technology. Compatibility and availability of the materials and tools, targeted applications, interconnection densities, throughput, fabrication cost, and homogeneity of the layers are some of the parameters that should be considered to select the most appropriate method. What follows is a brief summary of the motivation why those particular methods have been preferred in this study. Firstly, via-first and via-middle type TSVs can only be fabricated in a CMOS foundry. Secondly, C2C integration is employed due to the technological limitations and the difficulties of wafer-level processing for heterogeneous integration, as well as due to the compatibility issue of the MEMS tools with the CMOS wafers. TSVs are fabricated after dielectric bonding in order to eliminate the reliability problems related to the metal-metal bonding. Finally, B2F orientation is preferred in order to allow stacking of multiple layers in a modular manner. Compared to the blind-via fabrication techniques where the TSV is etched from the backside till the landing metal, the proposed strategy is much simpler since it eliminates several fabrication steps, such as metal-metal bonding and passivation layer patterning. On the other hand, main drawback is that the frontside vias block the BEOL layers; thus, an exclusion zone is required for each TSV.

3D Integration Based on Dry-Film Lithography

Dry-film resist is a thick photo-definable polymer film, which has been widely used in printed circuit board manufacturing. The film can be applied by lamination regardless of the substrate shape and dimension, and it does not require any clean room facility and expensive processing tools. Thickness uniformity, fast and simple processing, excellent adhesion, almost vertical sidewalls can be listed among the benefits of dry-film, which make it attractive in MEMS applications. It has been demonstrated that the dry-film can be used as the electroplating mold in LIGA-type processes as an alternative to SU-8 [27]. Vulto et al. proposed that the film can be employed in microfluidic channel fabrication by bonding two substrates with the patterned dry-film, where the biocompatibility and liquid sealing capability were also demonstrated [28,29]. More recently, three-dimensional microfluidic structures were fabricated through multilayer lamination and direct projection lithography [30]. Particularly for the 3D integration technology, CSEM (Switzerland) researchers presented a CMOS-compatible TSV fabrication process based on dry-film lithography [31]. Later, Jacquet et al. employed the dry-film to etch the dielectric passivation only at the bottom of the via by using the tenting property of the dry-film lamination [32]. In the present invention, we employ dry-film for chip embedding, via etching (top chip), surface passivation etching (bottom chip), redistribution layer (RDL) patterning (bottom chip), and via filling by Cu electroplating (bonded stack).

Figure 3:
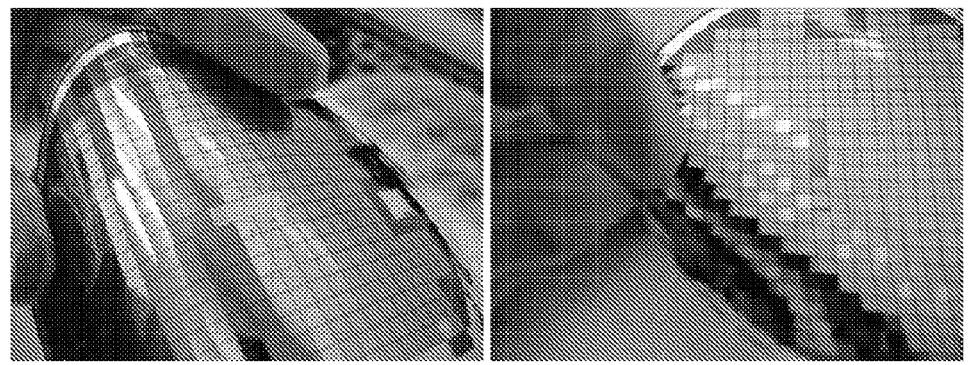
FIG. 3 contains camera photos of the diced and thinned wafer, where each chip measures 3.5 mm by 3.5 mm and the final thickness is 50 µm (The UV-tape is transferred to the backside after grinding for frontside inspection)

FIG. 2 illustrates the complete process flow used for post-CMOS processing and C2C stacking. For the first verification tests, dummy silicon chips with a thermal oxide layer (1 μm) and Ti/Al (20/200 nm) test patterns are fabricated. The top chip and the bottom chip comprise complementary patterns to form the daisy-chain connections after bonding and TSV fabrication. Having diced the wafers with an automatic dicing tool, the chips are transferred to the UV grinding tape. Then, the top chip and the bottom chip are thinned down to 50 μm by using Disco DAG810 automatic grinder. The chips are then released from the grinding tape after exposing the tape to the UV light (365 nm) by Powatec U-200 UV curing tool. FIG. 3 shows the camera photos of the wafer after dicing and grinding steps.

Chip Embedding

The proposed technique allows the processing of diced chips without the need of a carrier wafer having through openings for chip embedding. The photolithography process starts with the lamination of the dry-film on a single-side polished Si wafer (Step 1). Prior to the lamination, the wafer is exposed to $O_2$ plasma to clean and dehydrate the surface. ORDYL ALPHA940 (from ELGA EUROPE SRL) dry-film resist (40 μm thick) is laminated at 110° C. by using an office laminator. In this film, a negative-tone photosensitive layer is sandwiched between two polyester protective films, where the bottom protective film is removed before the lamination, and the top one is removed after exposure in order to prevent adhesion to the mask. For the exposure, two approaches can be followed: (i) exposure through the mask, and (ii) exposure by using the chip itself as the mask since dry-film is a negative-tone resist (Step 2). The first approach allows higher throughput as many chip openings can be patterned at the same time. However, this requires prior chip dimension measurement so that the mask can be designed accordingly. In the latter approach, on the other hand, the chip is placed on the dry-film and the exact chip area is transferred to the film by exposure. The disadvantage of this technique is that chips should be pre-aligned manually. After the exposure step, the unexposed regions are etched in $Na_2CO_3$ 1% solution. A short $O_2$ plasma cleaning follows the development and rinsing to remove the dry-film residuals. In this study, it is tested that 1 min (500 W) plasma cleaning is usually sufficient. Additional 1 min can be followed after inspection if there is still dry-film left at the patterned edges. However, long exposure to $O_2$ plasma may burn and destroy the film.

Photolithography and Post-Processing

Figure 4:
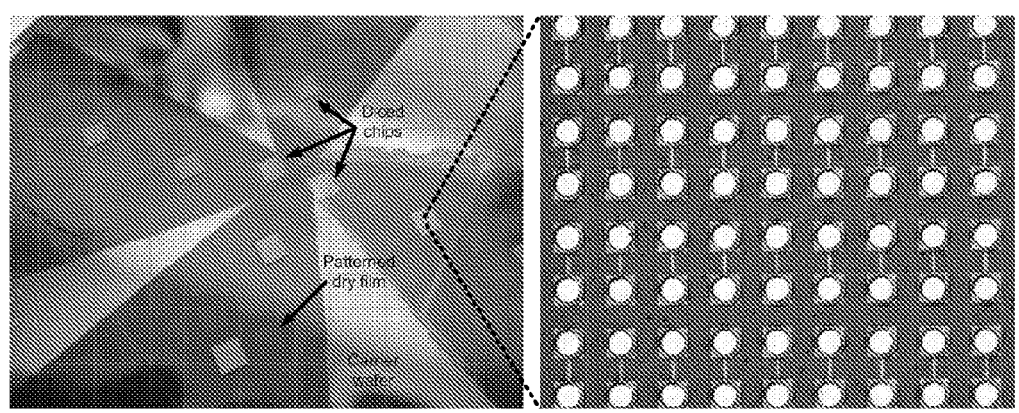
FIG. 4 contains a camera photo of the carrier wafer with the diced chips and patterned dry-film (left), and the microscope image showing the via openings on the dry-film and the Al pads on the chip (right)

The chips are placed into the openings in the following step (Step 3). Depending on the thickness of the chip, Si wafer with the dry-film openings can be etched by DRIE to have a deeper opening for thicker chips (Step 3.a). A second dry-film lamination step is then employed for patterning (Step 4). It is experimentally verified that the 40 μm-thick dry-film lamination can tolerate up to 100 μm of surface topography. Embedded and laminated chips are exposed to UV-light through a Cr mask for the patterning. In case the chip openings have been patterned by a mask with multiple chip opening layout, then whole wafer can be exposed with single exposure in the second photolithography step. Otherwise, if the chip itself has been used as the mask by manual placement, then each chip should be aligned and exposed one by one by using a shadow mask allowing exposure of only one chip at a time. FIG. 4 shows the carrier wafer after chip placement and dry-film lithography, and the microscope image of the dry-film patterns for via etching. Based on the photolithography test patterns, it is concluded that the circular openings having diameters less than 40 μm cannot be defined precisely due to the resolution limit of the dry-film employed. In order to clean the dry-film residues especially left at the edges of the smaller openings, the wafer is exposed to 500 W $O_2$ plasma for 2 minutes.

Figure 5:
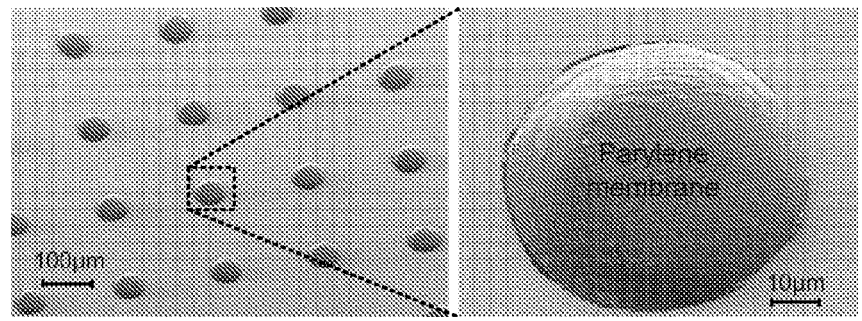
FIG. 5 shows a SEM photo of the chip after releasing the UV tape, leaving a 2 µm-thick parylene membrane on the frontside of the chip.

Following the second dry-film patterning for the via openings (top chip), the Al pad, dielectric layers, and the Si substrate are etched by anisotropic dry etching (Step 5.a). Here, two approaches are possible. If thick chips are used (Step 3.a), a blind via is created by partial etching, and then the chip backside is grinded till the via opening is reached. In the alternative approach, chips are thinned prior to the etching and embedded into the carrier wafer (Step 3.b), and then vias are formed by through etching. Following the etching process, the via sidewalls are passivated by parylene deposition. The use of polymer liner for TSV passivation has been previously demonstrated [7,33,34]. For the present invention, however, a novel technique is employed to eliminate the dielectric etching at the bottom of the via. The through-etched chips are placed on a UV-sensitive tape as the chip frontside is facing to the tape. Then, a pinhole-free and very conformal parylene layer is deposited at room temperature (Step 6.a). This deposition passivates the sidewalls and forms a parylene layer at the chip backside, which is used as the adhesive layer during C2C bonding. After exposing the tape to UV light, the tape is released, leaving a parylene membrane on the frontside, as shown in FIG. 5.

Chip-to-Chip Bonding

Figure 6A:
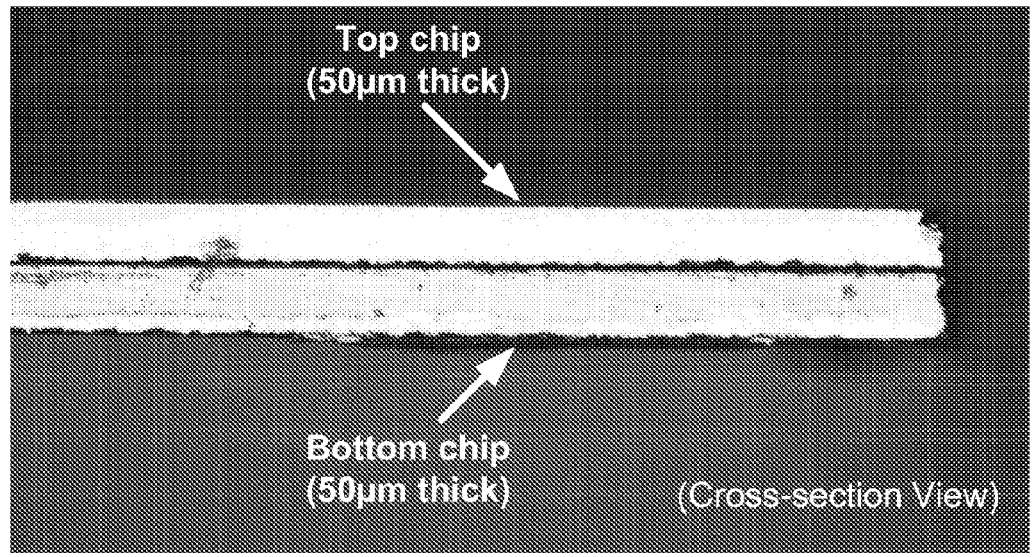
FIG. 6 shows (a) Microscope image of the cross-section of two 50 µm-thick chips bonded with parylene intermediate layer. (b) SEM photo of the top chip frontside after bonding.
Figure 6B:
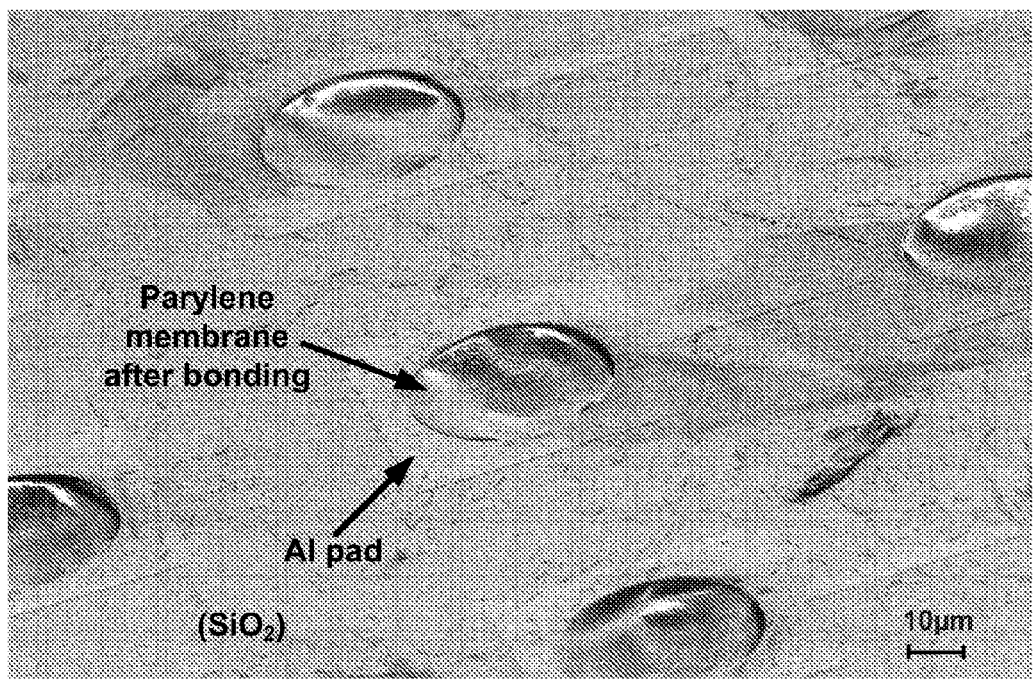

After the post-processing, the chips are aligned and bonded (Step 7). Here, both the template alignment technique [7] and surface-tension-driven self-alignment [21] can be employed. In the latter technique, top and bottom chips are exposed to a short $O_2$ plasma to turn the parylene surface to hydrophilic. The bottom chip is placed on a hydrophobic surface and two chips are aligned by a water droplet. Next, aligned chips are bonded by using a low-cost thermal nanoimprinter tool (Step 8). In the test vehicle, the adhesive bonding is performed at 200° C. for 30 min in EHN-3250 Thermal Nanoimprinter (ESCO, Japan). FIG. 6(a) shows the cross-section of two 50 μm-thick chips bonded by parylene intermediate layer. The SEM photo of the top chip surface is given in FIG. 6(b), which shows some deformation on the parylene membrane; however, this is not critical since the membrane will be etched in the next step, leaving the parylene only on the sidewalls.

Figure 7A:
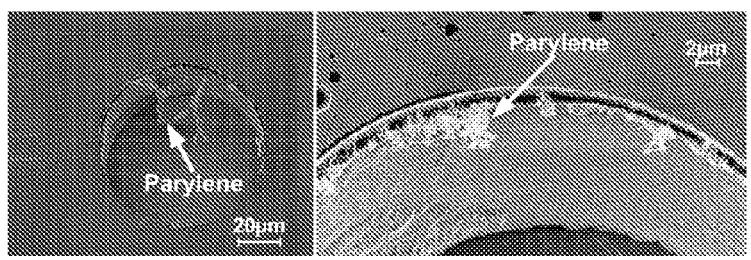
FIG. 7 shows (a) SEM photos showing the parylene residuals after the etching step. (b) SEM photo of the vias after parylene etching and washing steps.
Figure 7B:
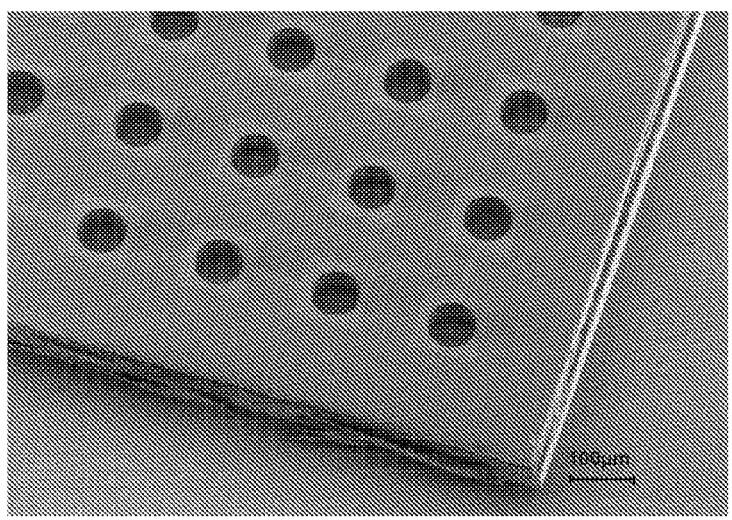

Following the bonding, the chip stack is temporarily attached to a Si carrier wafer by using a thermoplastic polymer wax, QUICKSTICK™135. The parylene membrane is then etched by maskless anisotropic parylene etching in $O_2$ plasma generated by STS Multiplex ICP (Step 9). In other TSV fabrication techniques, the dielectric passivation has to be etched at the bottom of the via. This requires either photolithography steps to protect the dielectric layer elsewhere, or a well-controlled etching process to properly clean the dielectric on the landing pad. This is usually difficult knowing the fact that etch rate decreases as the aspect-ratio of the via increases. The proposed approach, on the other hand, allows parylene etching only on the surface, which is much easier and controllable. Moreover, the technique allows both sidewall passivation and backside adhesive layer deposition steps in single parylene run. FIG. 7(a) shows the SEM images of the etched and passivated vias just after anisotropic parylene etching, showing the parylene residuals at the via edges. Thereby, the wafer with the mounted chip stacks is rinsed in DI water and dried with the $N_2$. FIG. 7(b) shows the chip stack after the washing and drying steps, showing no visible parylene residual.

Cu Electroplating

Figure 8:
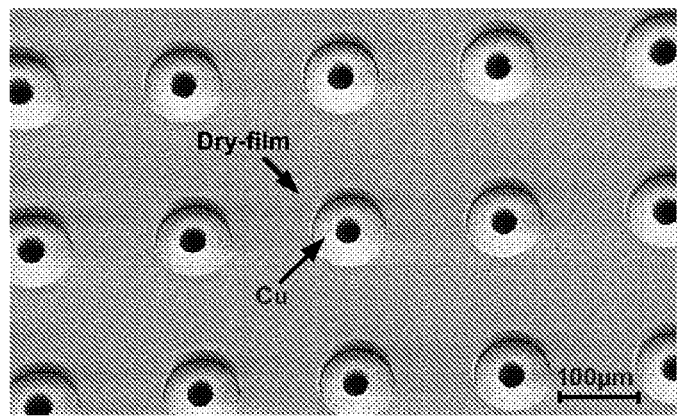
FIG. 8 shows a SEM photo showing the dry-film mask and the electroplated Cu inside the via openings.

In order to finalize the TSV, a conductive layer connecting the bottom pad to the top is required. Cu lining electrodeposition process is preferred since it allows less electrodeposition time compared to fully filling the openings [35]. In addition, more complex electroplating bath chemistries and techniques for void-free superconformal filling are avoided. In the present context, Cu lining is electroplated with INTER-VIA Cu 8510 bath by using sputtered Cu film as the seed layer. Prior to the deposition, the chip surface, particularly the oxide layer on the Al pads, is cleaned by Ar ion bombardment in BAS450 sputtering tool. Then, without breaking the vacuum, 500 nm of Cu is sputtered by DC magnetron sputtering (Step 10). Similar to the aforementioned photolithography steps, dry-film resist is laminated and patterned in order to inhibit the electroplating in the areas other than the TSV openings (Step 11). After the dry-film lithography, the wafer is exposed to 1 min of $O_2$ plasma to clean the dry-film residuals inside the openings and to increase the surface wettability. Electroplating is performed by applying a DC current controlled by a general-purpose potentiostat (from AMEL instruments). FIG. 8 shows the electroplated Cu grown inside the dry-film mask.

Figure 9:
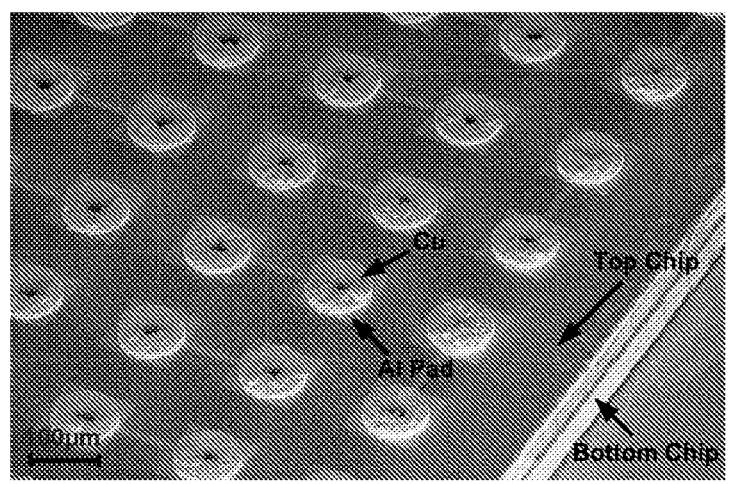
FIG. 9 shows a SEM photo of the vias after maskless seed layer etching.

Following the electroplating, rinsing and drying steps, the dry-film resist is stripped in NaOH 2.5% solution. Alternatively, it is verified that metal-ion-free positive-resist strippers can be employed with the help of elevated temperature (around 65° C.) and ultrasonic agitation. Cu seed layer is etched in $(NH_4)_2S_2O_8+H_2SO_4$ (96%) solution for 3 minutes with an etch rate of 200 nm/min. This etchant also etches the electroplated Cu, however, the etched thickness is negligible compared to the initial thickness of the electrodeposited Cu. The compatibility of the temporary mounting wax to this etchant is also verified in this step. The chip stack after the maskless seed layer etching is shown in FIG. 9, which clearly demonstrates the precision of the alignment and uniformity of the electroplating. Some roughness on Cu is observed and it is believed to be related to poor composition of the electroplating bath.

Figure 10:
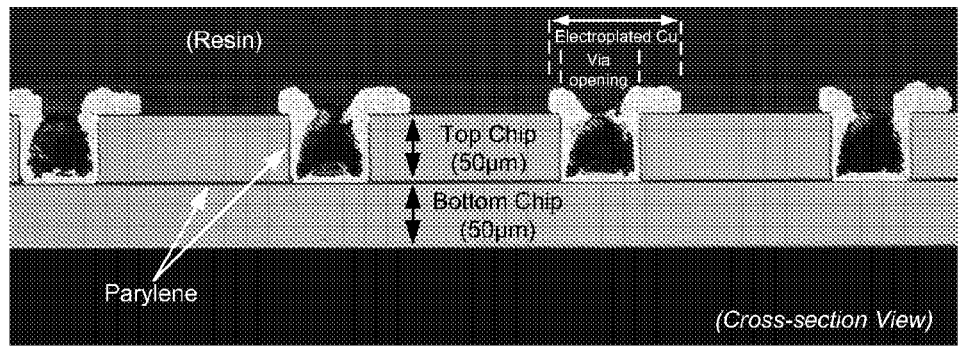
FIG. 10 shows a Cross section view of the TSVs after polishing, showing the 60 µm-diameter TSV opening and 100 µm-diameter electroplated Cu with 15 µm thickness on the surface.

For the cross-section inspection, the chips are released from the carrier wafer by placing the wafer on a hot plate around 100° C., at which the wax softens. The wax residuals at the chip backside are cleaned by acetone followed by isopropyl alcohol (IPA) cleaning. Then, the chip surface is covered by a special resin, and one edge of the stack is polished till the middle of the via. FIG. 10 shows the cross-section of the TSVs after the polishing step. The continuous Cu line from bottom pad to the top and the parylene between the chips and on the sidewalls are clearly visible. The off-centered plating at the top of the via is related to the misalignment of the final dry-film lithography. It is also seen that the Cu thickness decreases at the bottom of the via. This phenomenon is related to the higher electroplating rate at the chip surface, which can be controlled by optimizing the concentrations of the organic additives (accelerator, suppressor, and leveler), and by using reverse pulse electroplating techniques.

Daisy-Chain Measurements

Figure 11A:
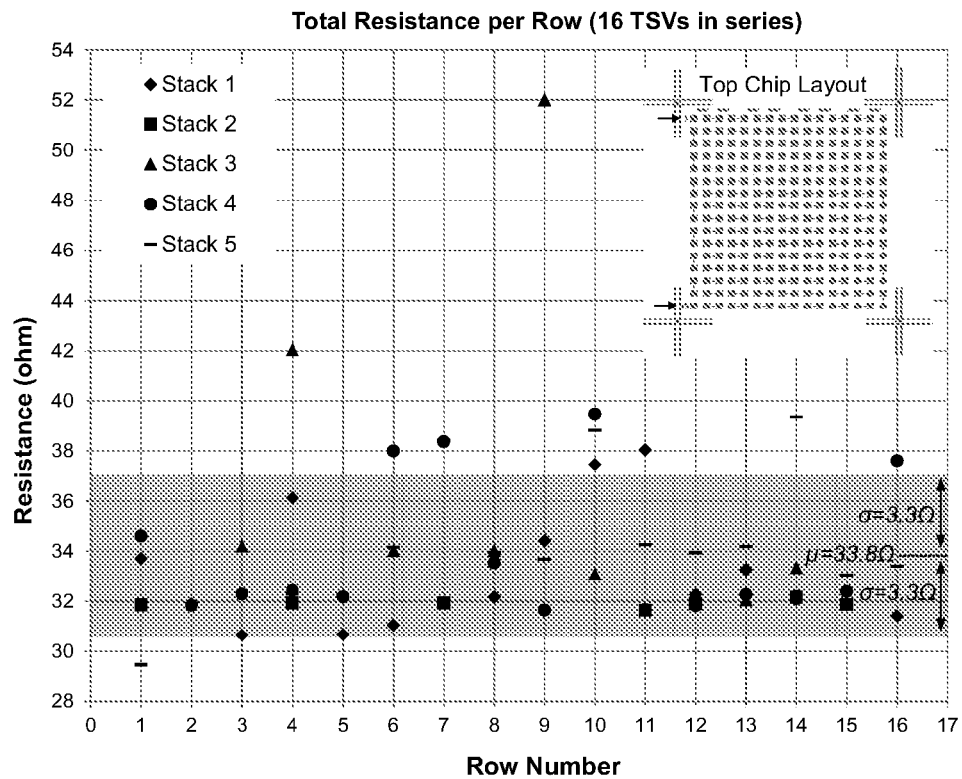
FIG. 11 shows (a) Resistance measurement results of 5 chip stacks fabricated through the same processing steps. (Inset: Layout of the top chip, showing 16 rows and 256 pads. Chain starts from top left corner and ends at bottom left corner). (b) Average TSV resistance extracted from first two and last two rows before and after heat treatment.
Figure 11B:
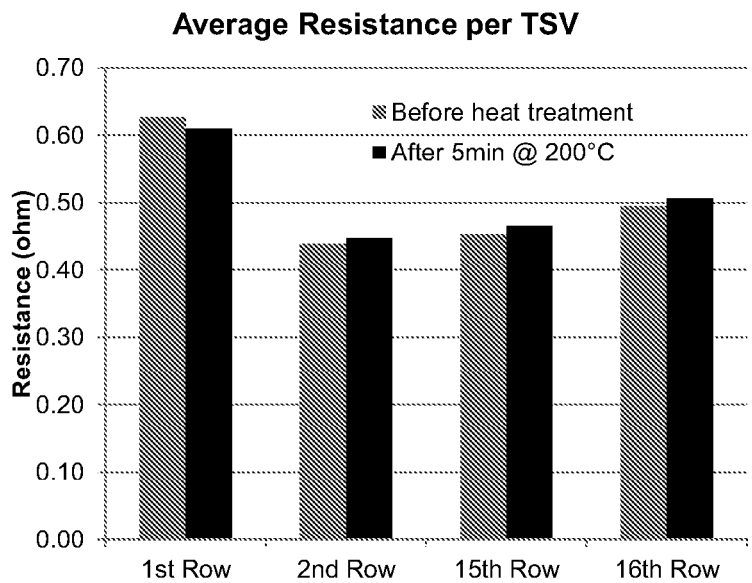

After the fabrication is finalized, the resistance measurements are performed for the TSVs connected in daisy-chain pattern. The series resistance is measured by HP4155B Semiconductor Parameter Analyzer connected to Karl Suss PM8 manual probe station. In order to have a statistical distribution of the TSV resistance and to demonstrate the reliability of the process, row resistance from 5 different chip stacks (each stack is composed of two 50 µm-thick chips having 16 rows, 16 columns, thus 256 TSVs.) is measured. FIG. 11(a) shows the row resistances (16 TSVs in series) including the interconnection resistance and off-chip cables. Among 1280 TSVs measured, just 10 open-circuit defects are detected, resulting in more than 99% yield. Moreover, the average row resistance is calculated as 33.8Ω with 3.3Ω standard deviation. The total contribution of the interconnections is then subtracted from the measured value and the resistance of single TSV is calculated as 0.5Ω, in average. Moreover, the chip is placed on a hot plate at 200° C. for 5 min and the resistance of the same rows are measured again. FIG. 11(b) gives the average resistance values before and after heat treatment, demonstrating no significant change.

CMOS Post-Processing and 3D Integration

Having verified the reliability of the proposed fabrication process with the dummy Si chips, the method is tested on real CMOS chips. Here, a multiprocessor chip is used as the test vehicle. The platform is aimed to be composed of completely identical stacked dies connected by TSVs, where each die features four 32-bit embedded processors and associated memory modules. The chip is manufactured in 10-metal UMC 90 nm process and measures 4×4 mm². The details of the processor architecture and the modular 3D multiprocessor approach can be found in [4].

Figure 12:
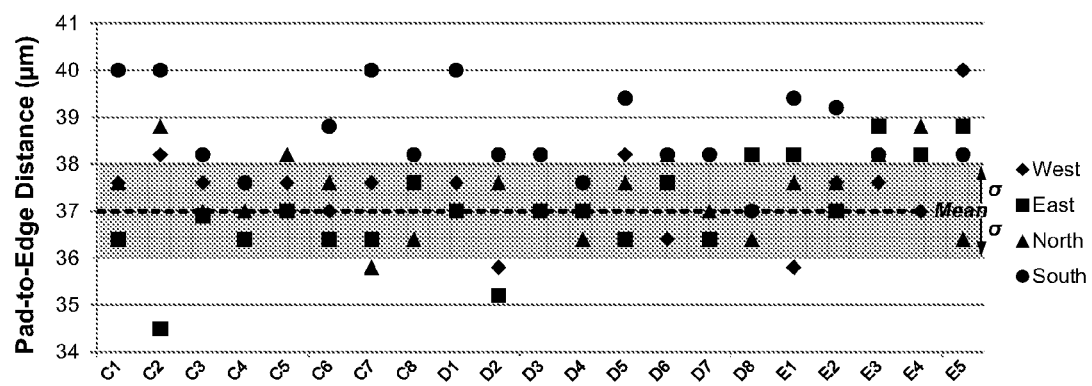
FIG. 12 shows pad-to-edge distance along all directions for the chips manufactured in UMC 90 nm process. Mean and standard deviation values are calculated as 37 µm and 1.1 µm, respectively. (Each chip in the box is labeled with a letter and a number (C1, C2, C3 . . . ), where letters represent the rows and numbers represent the columns)
Figure 13:
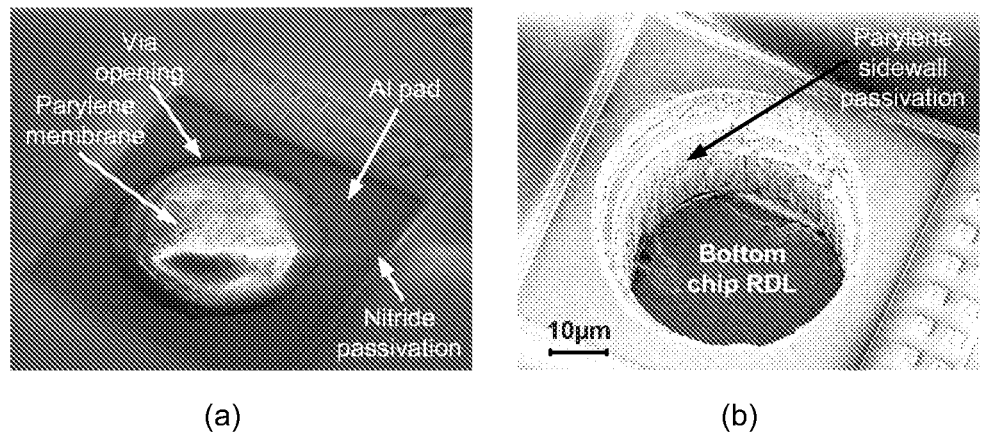
FIG. 13 shows (a) SEM image of the CMOS pad after via etching and parylene passivation by frontside UV-tape protection. (b) SEM image of the via opening after bonding and parylene etching, showing the sidewall parylene passivation and the RDL layer on the bottom chip.

Prior to the post-processing, the dimensions of CMOS chips are measured. FIG. 12 shows the pad-to-edge distance along all directions, where the mean and standard deviation values are calculated as 37 µm and 1.1 µm, respectively. This result shows that mask and C2C alignment steps can be done in good precision based on the physical dimensions. Firstly, 40 µm diameter via openings are etched on 60×60 µm² CMOS pads on the top chip by using Al RIE (1.2 µm), dielectric RIE (10 µm), and Si DRIE (40 µm), respectively. It is verified that 40 µm-thick dry-film is thick enough to survive till the end of all dry etching steps, especially the dielectric etching which has lower selectivity to the organic resists. 1 µm-thick parylene film is deposited to isolate the via sidewalls and the chip backside, where it will be used as the adhesive layer for bonding. FIG. 13(a) shows the parylene membrane after releasing the UV tape.

Figure 14:
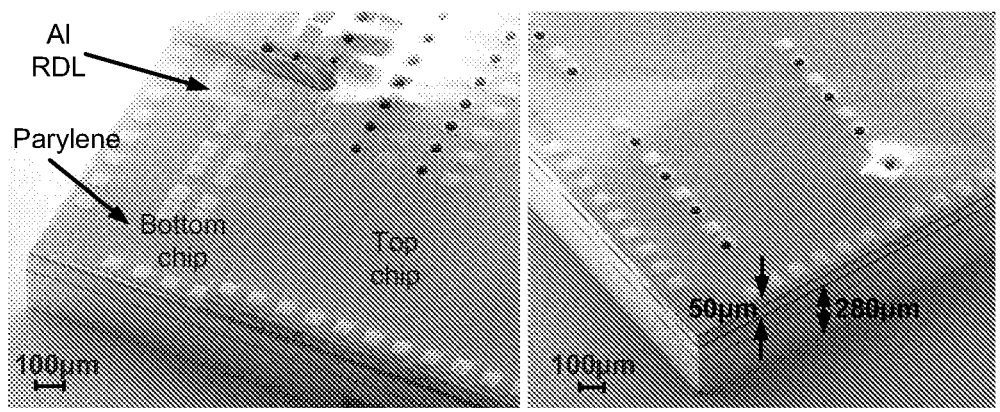
FIG. 14 shows SEM images of the bonded chips after anisotropic parylene etching. (An already broken chip is used as the top chip to inspect the alignment accuracy).

Since the two chips are targeted to be identical to reduce the non-recurring engineering costs, the surface of the bottom chip is passivated and RDL is patterned to reroute the signal to the upper tier. After the parylene passivation and patterning steps by dry-film lithography, RDL is patterned by lift-off process using the dry-film as the sacrificial layer. Alignment and bonding are done as explained for the dummy chips. Finally, parylene membrane on the top chip is etched by anisotropic $O_2$ plasma etching, as shown in FIG. 13(b). FIG. 14 shows the SEM images of the 50 µm- and 280 µm-thick CMOS chips post-processed, aligned and bonded in die-level. Currently, the impact of individual steps to the CMOS performance is being tested by the test setup explained in [4].

CONCLUSION

A C2C 3D integration platform based on post-CMOS processing and dry-film lithography is presented. Proposed techniques are applied to diced and thinned Si chips emulating real CMOS chips. Although the technology is demonstrated in die-level, some of the process steps are compatible to wafer-level processing as well. Two 50 µm-thick chips are successfully bonded, and then 60 µm-diameter TSVs with parylene sidewall passivation and electroplated Cu metallization are fabricated. It is believed that the TSV aspect-ratio can be increased by using MOCVD instead of PVD for the seed layer deposition, and by an electroplating setup enabling high-aspect-ratio deposition. A method eliminating the requirement of dielectric etching at the bottom of the via is demonstrated. Daisy-chain measurements show 0.5Ω TSV resistance in average, with a yield of more than 99% for 1280 TSVs from 5 different chip stacks. Then, the techniques are applied to CMOS microprocessor chips. For the bottom chip, the surface is passivated by parylene, which is patterned by dry-film lithography and RDL is fabricated by the Al lift-off process. For the top chip, Al, dielectric, and Si etching steps are performed by using a dry-film mask. Two chips are aligned by surface-tension-driven alignment and bonded at 200° C. by using a low-cost nanoimprinter tool. According to the invention the 3D integration technology, which is considered to be a very challenging process, can be accomplished in a MEMS clean room without using any expensive tool developed for this purpose. We believe that this chip-level post-processing technique can be used not only for chip stacking but also for applications where the CMOS layers have to be modified by surface or bulk micromachining, in case full CMOS wafer is not available or compatible, or very expensive for research purposes.

REFERENCES

[1] G. Moore, "Cramming more components onto integrated circuits," Electronics, vol. 38, no. 8, pp. 114-117, April 1965.
[2] P. Garrou, C. Bower, and P. Ramm, Eds., Handbook of 3D Integration: Technology and Applications of 3D Integrated Circuits, 1st ed. Wiley-VCH, October 2008.
[3] Y. Temiz, S. Kilchenmann, Y. Leblebici, and C. Guiducci, "3D integration technology for lab-on-a-chip applications," Electronics Letters, vol. 47, no. 26, pp. S22-S24, 2011.
[4] G. Beanato, P. Giovannini, A. Cevrero, P. Athanasopoulos, M. Zervas, Y. Temiz, and Y. Leblebici, "Design and testing strategies for modular 3D-multiprocessor systems using die-level through silicon via technology," IEEE Journal on Emerging and Selected Topics in Circuits and Systems, 2012 (accepted).
[5] G. Fedder, R. Howe, T. K. Liu, and E. Quevy, "Technologies for cofabricating MEMS and electronics," Proceedings of the IEEE, vol. 96, no. 2, pp. 306-322, February 2008.
[6] Y. Temiz, M. Zervas, C. Guiducci, and Y. Leblebici, "Die-level TSV fabrication platform for CMOS-MEMS integration," in Proc. 16th Int. Solid-State Sensors, Actuators and Microsystems Conf. (TRANSDUCERS), 2011, pp. 1799-1802.

[7] Y. Temiz, M. Zervas, C. Guiducci, and Y. Leblebici, "A CMOS-compatible chip-to chip 3D integration platform," in IEEE Electronic Components and Packaging Conference, 2012 (Accepted).

[8] M. Koyanagi, T. Nakamura, Y. Yamada, H. Kikuchi, T. Fukushima, T. Tanaka, and H. Kurino, "Three-Dimensional integration technology based on wafer bonding with vertical buried interconnections," IEEE Transactions on Electron Devices, vol. 53, no. 11, pp. 2799-2808, November 2006.

[9] T. Mitsuhashi, Y. Egawa, O. Kato, Y. Saeki, H. Kikuchi, S. Uchiyama, K. Shibata, J. Yamada, M. Ishino, H. Ikeda, N. Takahashi, Y. Kurita, M. Komuro, S. Matsui, and M. Kawano, "Development of 3D-Packaging process technology for stacked memory chips," MRS Online Proceedings Library, vol. 970, 2006.

[10] D. Henry, X. Baillin, V. Lapras, M. Vaudaine, J. Quemper, N. Sillon, B. Dunne, C. Hernandez, and E. Vigier-Blanc, "Via first technology development based on high aspect ratio trenches filled with doped polysilicon," in Electronic Components and Technology Conference, June 2007, pp. 830-835.

[11] M. Farooq, T. Graves-Abe, W. Landers, C. Kothandaraman, B. Himmel, P. Andry, C. Tsang, E. Sprogis, R. Volant, K. Petrarca, K. Winstel, J. Safran, T. Sullivan, F. Chen, M. Shapiro, R. Hannon, R. Liptak, D. Berger, and S. Iyer, "3D copper TSV integration, testing and reliability," in IEEE International Electron Devices Meeting (IEDM), December 2011, pp. 7.1.1-7.1.4.

[12] A. Redolfi, D. Velenis, S. Thangaraju, P. Nolmans, P. Jaenen, M. Kostermans, U. Baler, E. Van Besien, H. Dekkers, T. Witters, N. Jourdan, A. Van Ammel, K. Vandersmissen, S. Rodet, H. Philipsen, A. Radisic, N. Heylen, Y. Travaly, B. Swinnen, and E. Beyne, "Implementation of an industry compliant, 5×50 μm, via-middle wafers," in IEEE Electronic Components and Technology Conference (ECTC), June 2011, pp. 1384-1388.

[13] C. Ko and K. Chen, "Low temperature bonding technology for 3D integration," Microelectronics Reliability, vol. 52, no. 2, pp. 302-311, February 2012.

[14] P. Ramm, J. J. Lu, and M. M. V. Taklo, Eds., Handbook of Wafer Bonding. Wiley-VCH, February 2012.

[15] F. Niklaus, G. Stemme, J.-Q. Lu, and R. J. Gutmann, "Adhesive wafer bonding," Journal of Applied Physics, vol. 99, no. 3, p. 031101, 2006.

[16] J. H. 0, "TSV manufacturing yield and hidden costs for 3D IC integration," in Proc. 60th Electronic Components and Technology Conf. (ECTC), 2010, pp. 1031-1042.

[17] S. J. Koester, A. M. Young, R. R. Yu, S. Purushothaman, K. Chen, D. C. La Tulipe, N. Rana, L. Shi, M. R. Wordeman, and E. J. Sprogis, "Wafer-level 3D integration technology," IBM Journal of Research and Development, vol. 52, no. 6, pp. 583-597, November 2008.

[18] C. Ko and K. Chen, "Wafer-level bonding/stacking technology for 3D integration," Microelectronics Reliability, vol. 50, no. 4, pp. 481-488, April 2010.

[19] S. H. Lee, K. Chen, and J. J. Lu, "Wafer-to-wafer alignment for three dimensional integration: A review," Journal of Microelectromechanical Systems, vol. 20, no. 4, pp. 885-898, August 2011.

[20] J. Van Olmen, J. Coenen, W. Dehaene, K. De Meyer, C. Huyghebaert, A. Jourdain, G. Katti, A. Mercha, M. Rakowski, M. Stucchi, Y. Travaly, E. Beyne, and B. Swinnen, "3D stacked IC demonstrator using hybrid collective die-to-wafer bonding with copper through silicon vias (TSV)," in Proc. IEEE Int. Conf. 3D System Integration 3DIC 2009, 2009, pp. 1-5.

[21] T. Fukushima, E. Iwata, J. Bea, M. Murugesan, K. Lee, T. Tanaka, and M. Koyanagi, "Evaluation of alignment accuracy on chip-to-wafer self-assembly and mechanism on the direct chip bonding at room temperature," in Proc. IEEE Int. 3D Systems Integration Conf. (3DIC), 2010, pp. 1-5.

[22] J. Dalin and J. Wilde, "Self-assembly of micro-parts using electrostatic forces and surface tension," in Electronic Components and Technology Conference, May 2009, pp. 1517-1524.

[23] C. G. J. Fonstad, "Magnetically-Assisted statistical assembly—a new heterogeneous integration technique," Advanced Materials for Micro- and Nano-Systems (AMMNS), January 2002, Singapore-MIT Alliance (SMA).

[24] K. Sakuma, P. S. Andry, C. K. Tsang, K. Sueoka, Y. Oyama, C. Patel, B. Dang, S. L. Wright, B. C. Webb, E. Sprogis, R. Polastre, R. Horton, and J. U. Knickerbocker, "Characterization of stacked die using die-towafer integration for high yield and throughput," in Proc. 58th Electronic Components and Technology Conf. ECTC 2008, 2008, pp. 18-23.

[25] J.-C. Souriau, A. Jouve, and N. Sillon, "Temporary bonding for chips in wafer processing," in Proc. 11th Electronics Packaging Technology Conf. EPTC '09, 2009, pp. 412-415.

[26] Q. Chen, D. Zhang, Z. Wang, L. Liu, and J. J.-Q. Lu, "Chip-towafer (C2W) 3D integration with well-controlled template alignment and wafer-level bonding," in Proc. IEEE 61st Electronic Components and Technology Conf. (ECTC), 2011, pp. 1-6.

[27] A. Kukharenka, M. Farooqui, L. Grigore, M. Kraft, and N. Hollinshead, "Electroplating moulds using dry film thick negative photoresist," Micromech Microeng, vol. 13, pp. S67-S74, 2003.

[28] P. Vulto, N. Glade, L. Altomare, J. Bablet, L. D. Tin, G. Medoro, I. Chartier, N. Manaresi, M. Tartagni, and R. Guerrieri, "Microfluidic channel fabrication in dry film resist for production and prototyping of hybrid chips," Lab Chip, vol. 5, no. 2, pp. 158-162, January 2005.

[29] P. Vulto, T. Huesgen, B. Albrecht, and G. A. Urban, "A full-wafer fabrication process for glass microfluidic chips with integrated electroplated electrodes by direct bonding of dry film resist," Journal of Micromechanics and Microengineering, vol. 19, no. 7, p. 077001, July 2009.

[30] S. Zhao, H. Cong, and T. Pan, "Direct projection on dry-film photoresist (DP2): do-it-yourself three-dimensional polymer nnicrofluidics," Lab Chip, vol. 9, no. 8, pp. 1128-1132, April 2009.

[31] J. Gobet, J. Thiebaud, F. Crevoisier, and J. Moret, "IC-compatible fabrication of through-wafer conductive vias," Proceedings of SPIE, vol. 3223, no. 1, pp. 17-25, September 1997.

[32] F. Jacquet, D. Henry, J. Charbonnier, N. Bouzaida, N. Sillon, and J. Raine, "Cost effective dry lithography solution for through silicon via technology," in Electronic Components and Technology Conference, 2009. ECTC 2009. 59th, May 2009, pp. 1170-1176.

[33] F. E. Rasmussen, J. Frech, M. Heschel, and O. Hansen, "Fabrication of high aspect ratio through-wafer vias in CMOS wafers for 3-D packaging applications," in Proc. 12th Int. Conf. Solid-State Sensors, Actuators and Microsystems, vol. 2, 2003, pp. 1659-1662.

[34] Y. Civale, D. S. Tezcan, H. G. G. Philipsen, F. F. C. Duval, P. Jaenen, Y. Travaly, P. Soussan, B. Swinnen, and E.

Beyne, "3-D wafer-level packaging die stacking using spinon-dielectric polymer liner throughsilicon vias," IEEE Transactions on Components, Packaging and Manufacturing Technology, vol. 1, no. 6, pp. 833-840, 2011.

[35] R. Beica, C. Sharbono, and T. Ritzdorf, "Through silicon via copper electro-deposition for 3D integration," in Proc. 58th Electronic Components and Technology Conf. ECTC 2008, 2008, pp. 577-583.

The invention claimed is:

1. A method for performing a post processing pattern on a diced chip having a footprint, comprising the steps of:
   providing a support wafer;
   applying a first dry film photoresist to the support wafer;
   positioning a mask corresponding to the footprint of the diced chip on the first dry film photoresist;
   expose the mask and the first dry film photoresist to UV radiation;
   remove the mask;
   photoresist develop the exposed first dry film photoresist to obtain a cavity corresponding to the diced chip;
   positioning the diced chip inside the cavity;
   applying a second dry film photoresist to the first film photoresist and the diced chip; and
   expose and develop the second dry film photoresist applied to the diced chip in accordance with the post processing pattern.

2. A method for obtaining a stack of two semiconductor layers in a back to face configuration, whereby at least one of the semiconductor layer comprises a through silicon via (TSV), comprising the steps of:
   provide a first semiconductor layer;
   provide a second semiconductor layer;
   making a hole through the second semiconductor layer from a face side to a back side;
   apply the face side of second semiconductor layer on a release tape;
   depositing parylene on the assembly of the second semiconductor layer and the release tape, thereby obtaining a sidewall passivation in the hole and a bonding layer on the back side of the second semiconductor;
   releasing the release tape, thereby obtaining a membrane of parylene covering an opening of the hole on the front side;
   position the back side of the second semiconductor layer relative to a face side of the first semiconductor layer;
   bonding the second semiconductor layer to the first semiconductor by applying pressure and heat;
   removing the membrane of parylene by directional etching; and
   electrically connecting the face side of the second semiconductor to the face side of the first semiconductor by depositing a conductor inside the hole, thereby obtaining the TSV.

* * * * *